United States Patent
Otaki et al.

(10) Patent No.: US 9,847,263 B2
(45) Date of Patent: Dec. 19, 2017

(54) SUBSTRATE PROCESSING METHOD INCLUDING REPROCESSING REJECTED WAFERS

(71) Applicant: EBARA CORPORATION, Tokyo (JP)

(72) Inventors: Hirofumi Otaki, Tokyo (JP); Tsuneo Torikoshi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 14/668,885

(22) Filed: Mar. 25, 2015

(65) Prior Publication Data

US 2015/0279751 A1    Oct. 1, 2015

(30) Foreign Application Priority Data

Mar. 28, 2014    (JP) ................. 2014-069621

(51) Int. Cl.
*G01R 31/26* (2014.01)
*H01L 21/66* (2006.01)
(Continued)

(52) U.S. Cl.
CPC ............ *H01L 22/20* (2013.01); *B24B 37/042* (2013.01); *G05B 19/41865* (2013.01);
(Continued)

(58) Field of Classification Search
CPC ............... H01L 22/20; H01L 21/30625; H01L 21/67253
(Continued)

(56) References Cited

U.S. PATENT DOCUMENTS

2006/0162660 A1*   7/2006   Shimizu ............. G05B 19/4067
                                                        118/719
2007/0199655 A1    8/2007   Yokouchi et al.
(Continued)

FOREIGN PATENT DOCUMENTS

EP         1833077 A2    9/2007
JP         2006-203145   8/2006
(Continued)

OTHER PUBLICATIONS

Singapore Patent Application No. 10201502295; Search Report; dated Apr. 17, 2017; 3 pages.

*Primary Examiner* — Matthew Gordon
(74) *Attorney, Agent, or Firm* — Baker & Hostetler LLP

(57) ABSTRACT

A substrate processing method which can increase the yield by reprocessing a substrate whose processing has been interrupted by a processing interruption command during a substrate processing is disclosed. A substrate processing method performs a predetermined processing of a substrate while sequentially transporting the substrate to a plurality of processing sections according to a preset recipe. The substrate processing method includes processing a substrate in one of the processing sections; interrupting the processing of the substrate by a processing interruption command during processing of the substrate; setting the substrate whose processing has been interrupted in a standby state; and customizing the recipe and performing reprocessing of the processing-interrupted substrate according to the customized recipe, or performing reprocessing of the processing-interrupted substrate according to a preset recipe for reprocessing.

9 Claims, 5 Drawing Sheets

(51) Int. Cl.
*H01L 21/306* (2006.01)
*H01L 21/67* (2006.01)
*G05B 19/418* (2006.01)
*B24B 37/04* (2012.01)

(52) U.S. Cl.
CPC .. *H01L 21/30625* (2013.01); *H01L 21/67253* (2013.01); *H01L 21/67276* (2013.01); *G05B 2219/32097* (2013.01); *G05B 2219/45031* (2013.01); *Y02P 90/20* (2015.11)

(58) Field of Classification Search
USPC .......................................................... 438/5
See application file for complete search history.

(56) References Cited

U.S. PATENT DOCUMENTS

| | | | |
|---|---|---|---|
| 2007/0219660 A1 | 9/2007 | Kaneko et al. | |
| 2008/0223298 A1 | 9/2008 | Shimizu | |
| 2010/0312374 A1* | 12/2010 | Tsai | G01R 31/2894 |
| | | | 700/110 |
| 2014/0067324 A1* | 3/2014 | Ho | G05B 19/4065 |
| | | | 702/183 |

FOREIGN PATENT DOCUMENTS

| | | |
|---|---|---|
| JP | 2007-301690 A | 11/2007 |
| JP | 2009-200476 | 9/2009 |

* cited by examiner

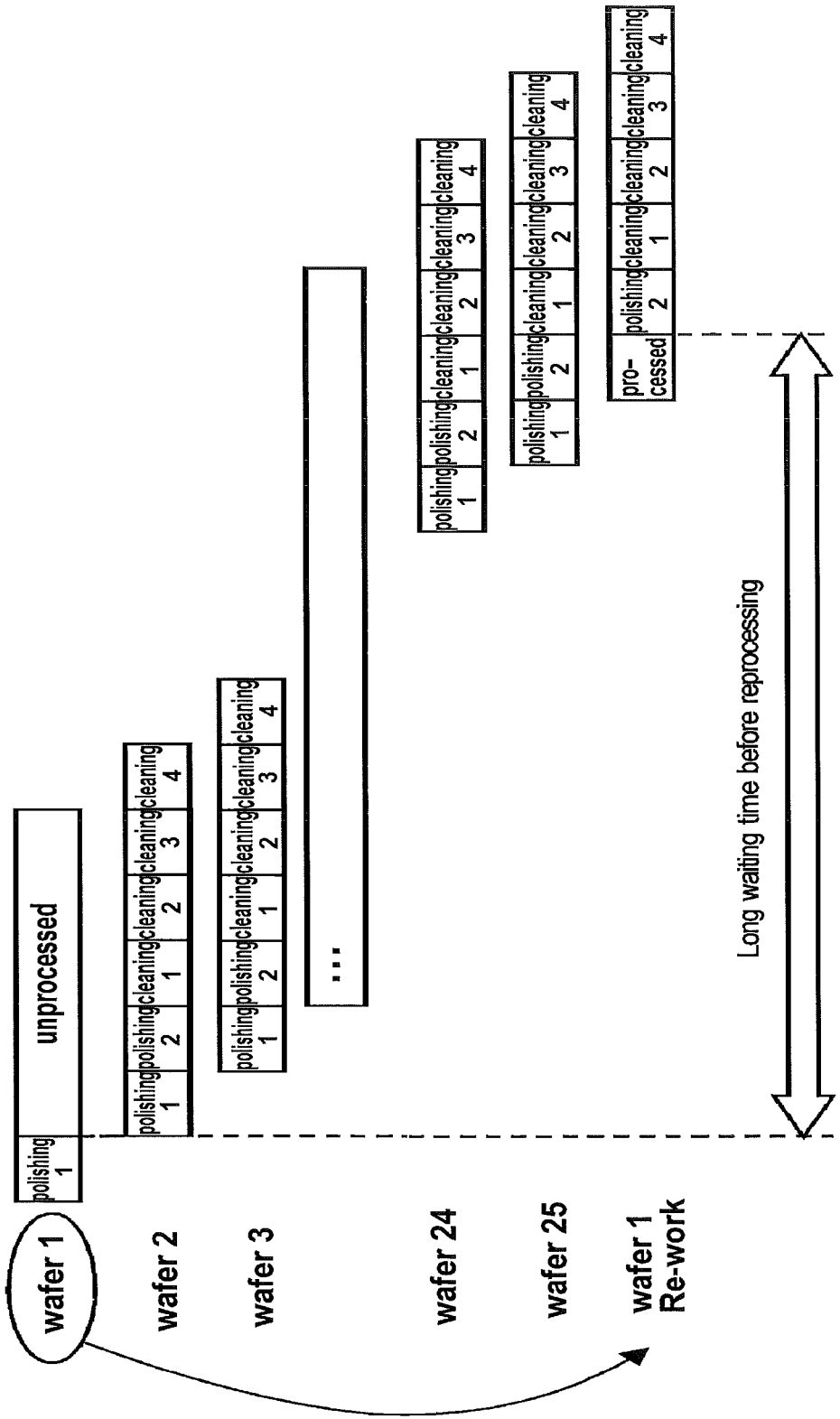

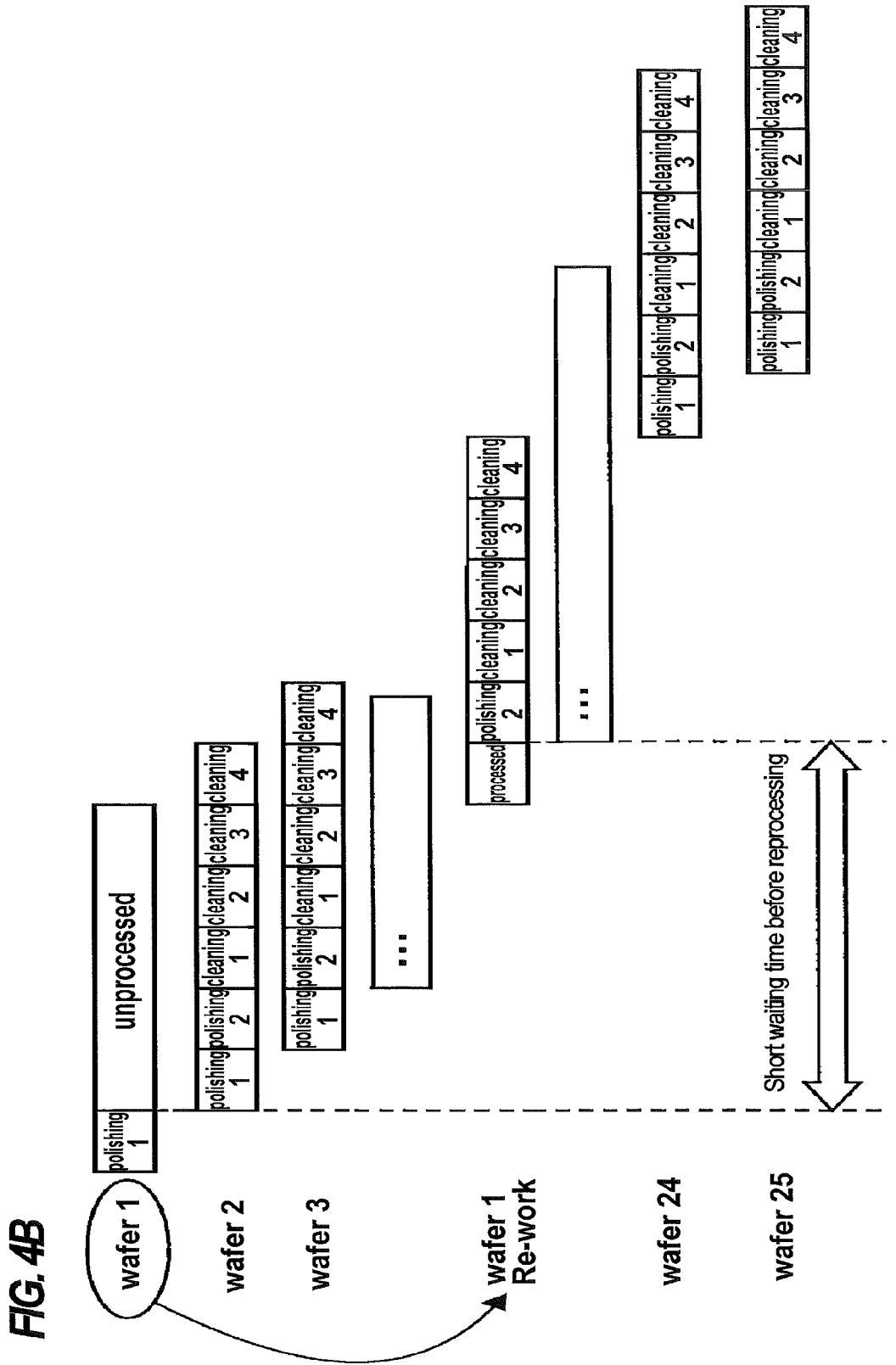

SUBSTRATE PROCESSING METHOD INCLUDING REPROCESSING REJECTED WAFERS

CROSS REFERENCE TO RELATED APPLICATION

This document claims priority to Japanese Patent Application Number 2014-069621 filed Mar. 28, 2014, the entire contents of which are hereby incorporated by reference.

BACKGROUND

In recent years, high integration and high density in semiconductor device demands smaller and smaller wiring patterns or interconnections and also more and more interconnection layers. Multilayer interconnections in smaller circuits result in greater steps which reflect surface irregularities on lower interconnection layers. An increase in the number of interconnection layers makes film coating performance (step coverage) poor over stepped configurations of thin films. Therefore, better multilayer interconnections need to have the improved step coverage and proper surface planarization. Further, since the depth of focus of a photolithographic optical system is smaller with miniaturization of a photolithographic process, a surface of the semiconductor device needs to be planarized such that irregular steps on the surface of the semiconductor device will fall within the depth of focus.

Thus, in a manufacturing process of a semiconductor device, it increasingly becomes important to planarize a surface of the semiconductor device. One of the most important planarizing technologies is chemical mechanical polishing (CMP). In the chemical mechanical polishing, using a polishing apparatus, while a polishing liquid (slurry) containing abrasive particles such as silica ($SiO_2$) or ceria ($CeO_2$) therein is supplied onto a polishing pad, a substrate such as a semiconductor wafer is brought into sliding contact with the polishing pad, so that the substrate is polished.

Improvement in the yield and enhancement in the operating rate of equipment are important issues for a semiconductor device manufacturing process including a CMP process. Therefore, a system such as EES (Equipment Engineering System) or FDC (Fault Detection & Classification) has been introduced in a fabrication plant (Fab) to monitor the operational situation of semiconductor manufacturing equipment, thereby preventing a lowering of the yield. In the case of a CMP apparatus, processing point data on a polishing table, a polishing head (top ring), a slurry, a dresser, and the like are reported to the FDC system in the fabrication plant (Fab), and the FDC system collects and analyzes such data to monitor variation in the data. Depending on the variation, the CMP apparatus receives a command to interrupt processing (FDC error) from the FDC system. The processing interruption command is, for example, a command to immediately terminate polishing of a wafer which is being processed in a first polishing step, and to return the wafer to a cassette without applying the wafer to a second polishing step and the following steps, i.e., with skipping the subsequent process steps. Further, other unprocessed wafers in the cassette also are treated as skipped wafers and become processing-completed wafers. These wafers are reported as "rejected" or "skipped" to the FDC system in the fabrication plant (Fab).

There is a demand in these days to rescue such wafers, whose processing have been terminated by a processing interruption command, by performing reprocessing of the wafers as much as possible. In the CMP apparatus, a wafer is subjected to a multi-stage polishing process in a plurality of chambers, and thus a reprocessing process for a wafer differs significantly depending on the process step in which processing of the wafer is interrupted, i.e., depending on whether processing of the wafer is interrupted in a first polishing step, in a second polishing step, or in a cleaning step after the polishing process. It is therefore necessary for the reprocessing of the wafer to customize the recipe depending on the interrupted case. However, the apparatus is remotely controlled online by a host computer in the fabrication plant (Fab). As a general rule, a single recipe is provided for a wafer cassette. Therefore, in order to assign a new recipe for reprocessing after interruption, it is necessary to carry a wafer carrier out of the apparatus, carry the wafer carrier again into the apparatus and re-register the recipe. In this case, a waiting time for the carrying-in of the wafer carrier again becomes a loss of time before the start of reprocessing, and there are many non-rescuable cases.

SUMMARY OF THE INVENTION

According to an embodiment, there is provided a substrate processing method which can increase the yield by reprocessing a substrate whose processing has been interrupted by a processing interruption command during a substrate processing.

Embodiments, which will be described below, relate to a substrate processing method for processing a substrate such as a semiconductor wafer while sequentially transporting the substrates to a plurality of processing sections according to a preset recipe.

In an embodiment, there is provided a substrate processing method for performing a predetermined processing of a substrate while sequentially transporting the substrate to a plurality of processing sections according to a preset recipe, the substrate processing method comprising: processing a substrate in one of the processing sections; interrupting the processing of the substrate by a processing interruption command during processing of the substrate; setting the substrate whose processing has been interrupted in a standby state; and customizing the recipe and performing reprocessing of the processing-interrupted substrate according to the customized recipe, or performing reprocessing of the processing-interrupted substrate according to a preset recipe for reprocessing.

In an embodiment, a report on the results of processing to an online system is suspended for the substrate set in a standby state.

In an embodiment, the substrate set in a standby state is set in a standby state on a transport device for transporting the substrate.

In an embodiment, the reprocessing of the substrate comprises performing the remaining processing in the predetermined processing after the interrupting.

In an embodiment, the predetermined processing comprises a plurality of process steps; a plurality of recipes for reprocessing, corresponding to the plurality of process steps, are prepared, and the recipe for reprocessing is automatically selected according to the process step which has been performed when interrupting the processing of the substrate.

In an embodiment, the reprocessing of the processing-interrupted substrate is performed in preference to an unprocessed substrate when interrupting the processing of the substrate.

In an embodiment, when there are a plurality of substrates whose processing has been interrupted, the preference order of reprocessing of the substrates is selectable.

In an embodiment, the results of processing are reported to an online system after completion of the reprocessing of the substrate.

The substrate processing method of the above-described embodiments has the following advantages:

1) The yield can be increased by reprocessing a substrate whose processing has been interrupted by a processing interruption command during a substrate processing.

2) The number of substrates which are discarded can be significantly reduced by shortening the waiting time of a processing-interrupted substrate before reprocessing.

BRIEF DESCRIPTION OF THE DRAWINGS

FIGS. 4A and 4B are timing charts showing the order of processing of re-work wafers, and FIG. 4A shows the case where a re-work wafer is transported to the end of "same job" and FIG. 4B shows the case where a re-work wafer is transported to the front of unprocessed wafers.

DESCRIPTION OF EMBODIMENTS

Figure 1:
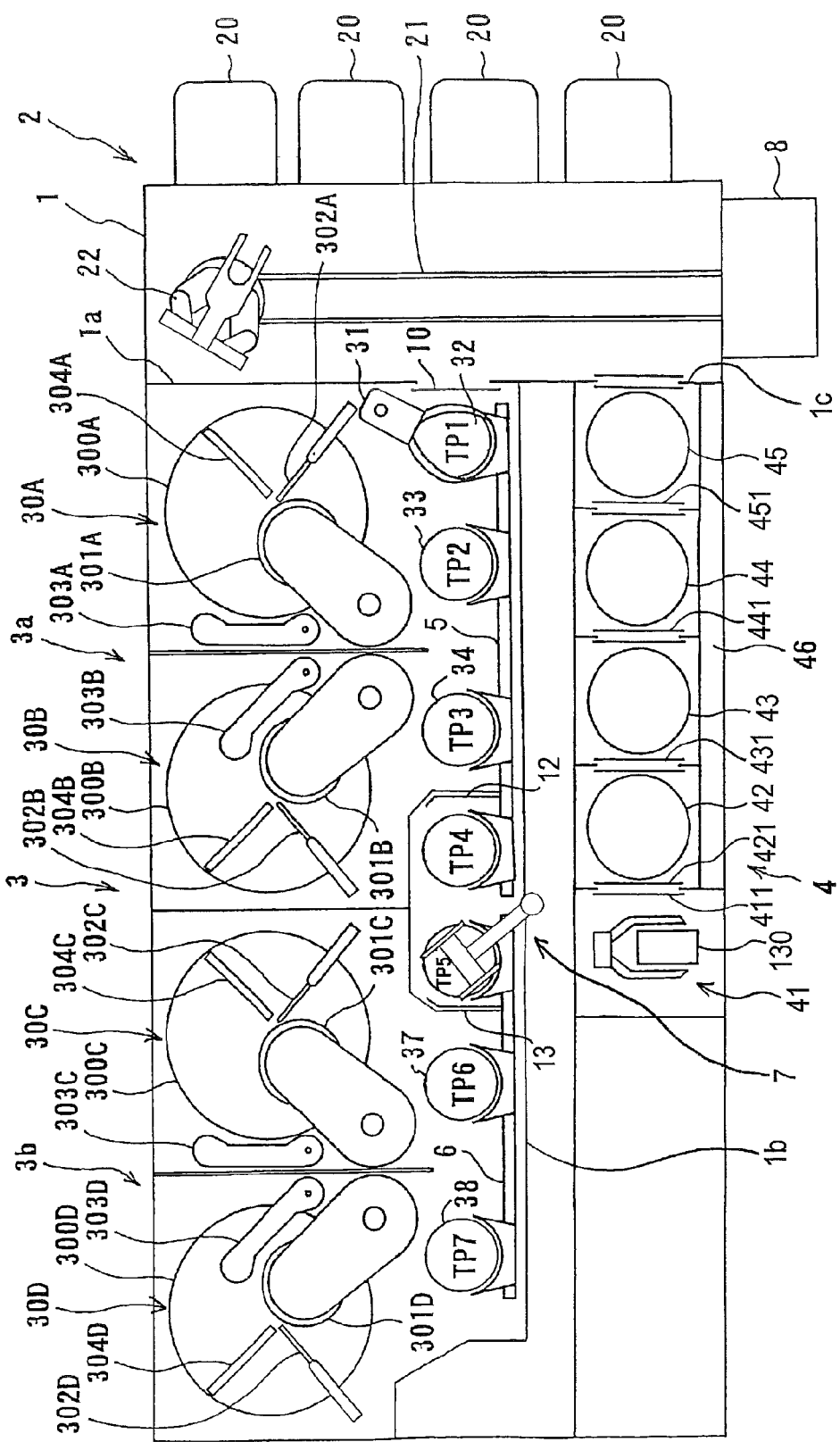
FIG. 1 is a plan view showing an entire structure of a polishing apparatus as a substrate processing apparatus according to an embodiment.

A substrate processing apparatus according to an embodiment will be described below with reference to FIGS. 1 through 4B. Like or corresponding parts are denoted by like or corresponding reference numerals in FIGS. 1 through 4B and will not be described below repetitively. In this embodiment, a polishing apparatus will be described as a substrate processing apparatus and a wafer will be described as a substrate to be processed.

FIG. 1 is a plan view showing an entire structure of a polishing apparatus as a substrate processing apparatus according to an embodiment. As shown in FIG. 1, the polishing apparatus according to the embodiment has a housing 1 in a generally-rectangular shape. An interior space of the housing 1 is divided into a loading/unloading section 2, a polishing section 3 (3a, 3b), and a cleaning section 4 by partition walls 1a, 1b and 1c. The loading/unloading section 2, the polishing sections 3a, 3b, and the cleaning section 4 are assembled independently of each other, and air is discharged from these sections independently of each other.

The loading/unloading section 2 has two or more (four in this embodiment) front loading units 20 on which wafer cassettes, each storing a number of semiconductor wafers, are placed. The front loading units 20 are arranged adjacent to each other along a width direction of the polishing apparatus (a direction perpendicular to a longitudinal direction of the polishing apparatus). Each of the front loading units 20 is capable of receiving thereon an open cassette, are SMIF (Standard Manufacturing Interface) pod, or a FOUP (Front Opening Unified Pod). The SMIF and FOUP are a hermetically sealed container which houses a wafer cassette therein and is covered with a partition to thereby provide an independent interior environment isolated from an external space.

Further, the loading/unloading section 2 has a moving mechanism 21 extending along an arrangement direction of the front loading units 20. A transport robot 22 is installed on the moving mechanism 21 and is movable along the arrangement direction of the wafer cassettes. The transport robot 22 is configured to move on the moving mechanism 21 so as to access the wafer cassettes mounted on the front loading units 20. The transport robot 22 has vertically arranged two hands, which can be separately used. For example, the upper hand is used for returning a semiconductor wafer to the wafer cassette, and the lower hand is used for transferring a semiconductor wafer before polishing.

The loading/unloading section 2 is required to be a cleanest area. Therefore, pressure in the interior of the loading/unloading section 2 is kept higher at all times than pressures in the exterior space of the polishing apparatus, the polishing section 3, and the cleaning section 4. A filter fan unit (not shown) having a clean air filter, such as a HEPA filter and a ULPA filter, is provided above the moving mechanism 21 of the transport robot 22. This filter fan unit removes particles, toxic vapor, and gas from air to produce clean air, and to from downward flow of the clean air at all times.

The polishing section 3 is an area where a semiconductor wafer is polished. This polishing section 3 includes a first polishing section 3a having therein a first polishing unit 30A and a second polishing unit 30B, a second polishing section 3b having therein a third polishing unit 30C and a fourth polishing unit 30D. The first polishing unit 30A, the second polishing unit 30B, the third polishing unit 30C, and the fourth polishing unit 30D are arranged along the longitudinal direction of the polishing apparatus as shown in FIG. 1.

As shown in FIG. 1, the first polishing unit 30A includes a polishing table 300A having a polishing pad (polishing surface), a top ring 301A for holding a semiconductor wafer and pressing the semiconductor wafer against the polishing pad on the polishing table 300A to polish the semiconductor wafer, a polishing liquid supply nozzle 302A for supplying a polishing liquid and a dressing liquid (e.g., water) onto the polishing pad on the polishing table 300A, a dressing apparatus 303A for dressing the polishing pad on the polishing table 300A, and an atomizer 304A for ejecting a mixed fluid of a liquid (e.g., pure water) and a gas (e.g., nitrogen gas) or a liquid (e.g., pure water) in an atomized state onto the polishing pad from one or plural nozzles. Similarly, the second polishing unit 30B includes a polishing table 300B, a top ring 301B, a polishing liquid supply nozzle 302B, a dressing apparatus 303B, and an atomizer 304B. The third polishing unit 30C includes a polishing table 300C, a top ring 301C, a polishing liquid supply nozzle 302C, a dressing apparatus 303C, and an atomizer 304C. The fourth polishing unit 30D includes a polishing table 300D, a top ring 301D, a polishing liquid supply nozzle 302D, a dressing apparatus 303D, and an atomizer 304D.

A first linear transporter 5 is provided between the first polishing unit 30A and the second polishing unit 30B in the first polishing section 3a, and the cleaning section 4. This first linear transporter 5 is configured to transfer wafers between four transferring positions located along the longitudinal direction of the polishing apparatus (hereinafter, these four transferring positions will be referred to as a first transferring position TP1, a second transferring position TP2, a third transferring position TP3, and a fourth transferring position TP4 in the order from the loading/unloading section 2). A reversing machine 31 for reversing a wafer received from the transport robot 22 in the loading/unloading section 2 is disposed above the first transferring position TP1 of the first linear transporter 5. A vertically movable lifter 32 is disposed below the reversing machine 31. A vertically movable pusher 33 is disposed below the second transferring position TP2, and a vertically movable pusher 34 is disposed below the third transferring position TP3. A shutter 12 is provided between the third transferring position TP3 and the fourth transferring position TP4.

In the second polishing section 3b, a second linear transporter 6 is provided next to the first linear transporter 5. This second linear transporter 6 is configured to transfer substrates between three transferring positions located along the longitudinal direction of the polishing apparatus (hereinafter, these three transferring positions will be referred to as a fifth transferring position TP5, a sixth transferring position TP6, and a seventh transferring position TP7 in the order from the loading/unloading section 2). A pusher 37 is disposed below the sixth transferring position TP6 of the second linear transporter 6, and a pusher 38 is disposed below the seventh transferring position TP7 of the second linear transporter 6. A shutter 13 is provided between the fifth transferring position TP5 and the sixth transferring position TP6.

As can be understood from the fact that a slurry is used during polishing, the polishing section 3 is the dirtiest area. Therefore, in order to prevent particles from spreading out of the polishing section 3, evacuation is conducted from surrounding spaces of the respective polishing tables in this embodiment. In addition, pressure in the interior of the polishing section 3 is set to be lower than any of pressure outside the apparatus, pressure in the cleaning section 4, and pressure in the loading/unloading section 2, so that scattering of the particles is prevented. Typically, exhaust ducts (not shown) are provided below the polishing tables, respectively, and filters (not shown) are provided above the polishing tables, so that downward flows of cleaned air are formed through the filters and the exhaust ducts.

The polishing units 30A, 30B, 30C and 30D are each partitioned and closed by a partition wall, and the air is exhausted individually from each of the closed polishing units 30A, 30B, 30C and 30D. Thus, a semiconductor wafer can be processed in the closed polishing unit 30A, 30B, 30C or 30D without being influenced by the atmosphere of a slurry. This enables good polishing of the substrate. As shown in FIG. 1, the partition walls between the polishing units 30A, 30B, 30C and 30D each have an opening for passage of the linear transporters 5, 6. It is also possible to provide each opening with a shutter, and to open the shutter only when a wafer passes through the opening.

The cleaning section 4 is an area where polished semiconductor wafers are cleaned. The cleaning section 4 includes a reversing machine 41 for reversing a semiconductor wafer, four cleaning apparatuses 42, 43, 44 and 45 each for cleaning the polished semiconductor wafer, and a transferring unit 46 for transferring wafers between the reversing machine 41 and the substrate cleaning apparatuses 42, 43, 44 and 45. The reversing machine 41 and the substrate cleaning apparatuses 42, 43, 44 and 45 are arranged in series along the longitudinal direction of the polishing apparatus. A filter fan unit (not shown), having a clean air filter, is provided above the substrate cleaning apparatuses 42, 43, 44 and 45. This filter fan unit is configured to remove particles from air to produce clean air, and to form downward flow of the clean air at all times. Pressure in the interior of the cleaning section 4 is kept higher at all times than pressure in the polishing section 3, so that particles in the polishing section 3 are prevented from flowing into the cleaning section 4.

As shown in FIG. 1, a swing transporter (wafer transferring mechanism) 7 is provided between the first linear transporter 5 and the second linear transporter 6, for transferring a wafer between the first linear transporter 5, the second linear transporter 6, and the reversing machine 41 of the cleaning section 4. The swing transporter 7 is configured to transfer a wafer from the fourth transferring position TP4 of the first linear transporter 5 to the fifth transferring position TP5 of the second linear transporter 6, from the fifth transferring position TP5 of the second linear transporter 6 to the reversing machine 41, and from the fourth transferring position TP4 of the first linear transporter 5 to the reversing machine 41, respectively.

An exemplary substrate processing process, performed by means of the polishing apparatus configured as shown in FIG. 1, will now be described.

When performing two-stage polishing of a wafer using two polishing tables (polishing the wafer by the polishing table 300A, and subsequently polishing the wafer by the polishing table 300B), the wafer is processed while it is transported as follows: a wafer cassette in the front loading unit 20→the transport robot 22→the reversing machine 31→the lifter 32→the first linear transporter 5→the pusher 33→the top ring 301A→the polishing table 300A→the pusher 33→the first linear transporter 5→the pusher 34→the top ring 301B→the polishing table 300B→the pusher 34→the first linear transporter 5→the swing transporter 7→the reversing machine 41→the temporary placing stage 130→the transferring unit 46→the first cleaning apparatus 42→the transferring unit 46→the second cleaning apparatus 43→the transferring unit 46→the third cleaning apparatus 44→the transferring unit 46→the fourth cleaning apparatus 45→the transport robot 22→the wafer cassette in the front loading unit 20.

Specifically, the wafer taken from the wafer cassette in the frontloading unit 20 is polished by the polishing table 300A (polishing 1), and the polished wafer is subsequently polished by the polishing table 300B (polishing 2). The wafer after the two-stage polishing process is cleaned in the first cleaning apparatus 42 (cleaning 1), then cleaned in the second cleaning apparatus 43 (cleaning 2), subsequently cleaned in the third cleaning apparatus 44 (cleaning 3), and lastly cleaned in the fourth cleaning apparatus 45 (cleaning 4). The cleaned wafer is returned to the wafer cassette in the front loading unit 20. In this manner, the substrate processing process which comprises the two-stage polishing process comprising polishing 1 and polishing 2, and the four-stage cleaning process comprising cleaning 1 to cleaning 4, is performed by the polishing apparatus shown in FIG. 1.

A description will now be given of a processing process in the case where an abnormality that will interfere with processing of a substrate occurs during the above-described substrate processing process.

Figure 2:
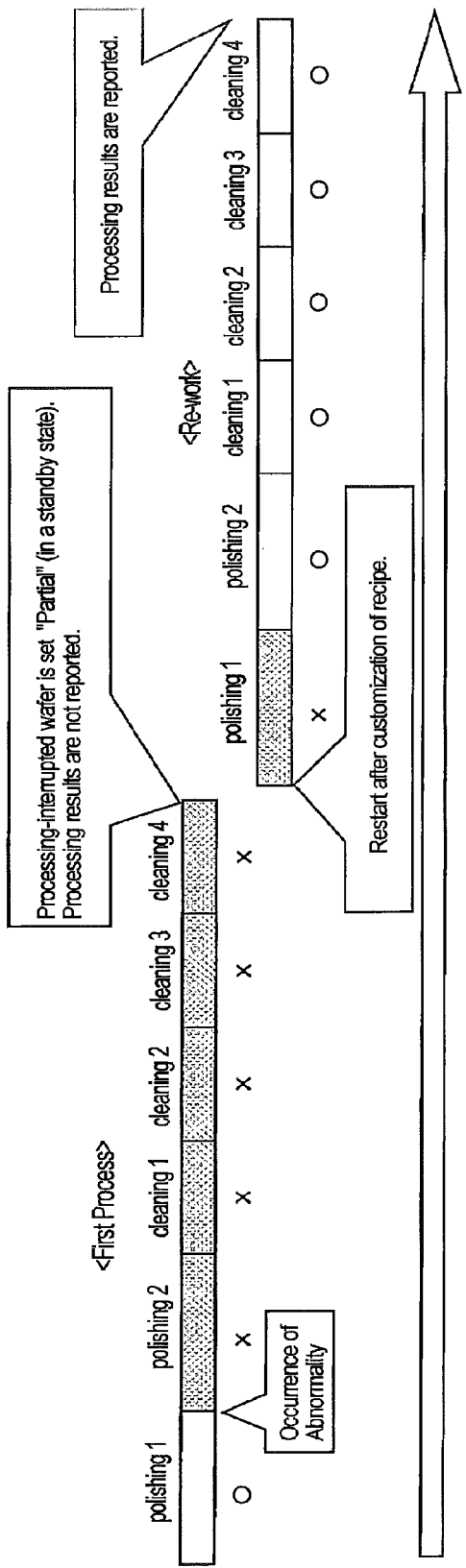
FIG. 2 is a time chart showing a processing process in the case where an abnormality occurs after the completion of polishing 1 for a wafer.

FIG. 2 is a time chart showing a processing process in the case where an abnormality occurs after the completion of polishing 1 for a wafer. As shown in the upper time chart of FIG. 2, when an abnormality occurs after the completion of polishing 1 for a wafer, the polishing apparatus receives a processing interruption command from an FDC system in a fabrication plant (Fab), and interrupts the subsequent process steps, i.e., polishing 2 and cleaning 1 to cleaning 4, for the wafer. In the upper time chart of FIG. 2, the mark "○" indicates executed processing, and the mark "x" indicates interrupted processing. The wafer whose processing has been terminated by the processing interruption command is temporarily set and kept in a standby state (Partial) on a transport device, and a report on the results of processing of the wafer to an online system in the fabrication plant (Fab) is suspended (the processing results are not reported to the online system). Thereafter, the polishing apparatus automatically turns into a standby state (Partial). In this manner, the polishing apparatus becomes in the standby state (Partial) and the recipe can be customized.

The middle time chart of FIG. 2 is a time chart of reprocessing (Re-work) after customization of the recipe, and processing of the wafer is restarted according to this time chart. Because polishing 1 has been completed for the processing-interrupted wafer, processing of the wafer restarts from polishing 2 and proceeds to cleaning 1 to cleaning 4. In the middle time chart of FIG. 2, the mark "x" indicates processing not to be executed, and the mark "○" indicates processing to be executed. After the restart, when the last processing step of cleaning 4 is executed, the results of processing are reported to the online system in the fabrication plant (Fab).

The lower time chart of FIG. 2 is a time chart as viewed from the online system in the fabrication plant (Fab). As depicted, the interruption of processing due to the occurrence of an abnormality is not recognized by the online system, and the processing process for the processing-interrupted wafer is treated as a sequence of process steps. Because the FDC system is an independent system, even when the FDC system issues a processing interruption command, the online system determines the process to be normally completed when processing of the lot is finally completed in the polishing apparatus side.

Figure 3:
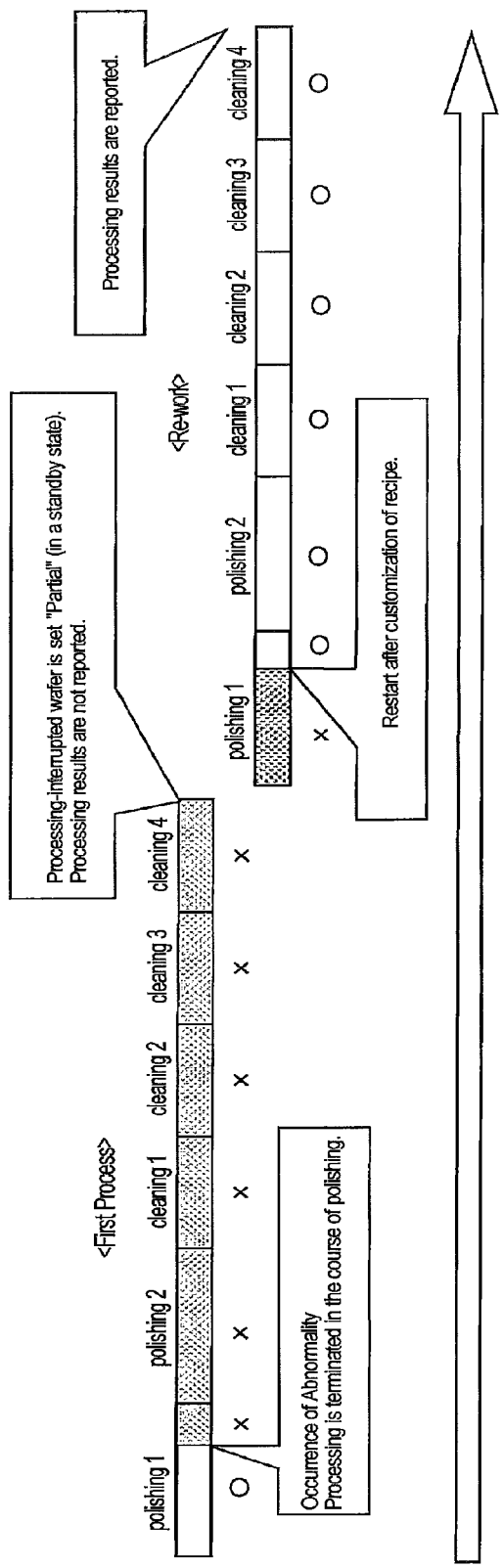
FIG. 3 is a time chart showing a processing process in the case where an abnormality occurs during polishing 1 for a wafer.

FIG. 3 is a time chart showing a processing process in the case where an abnormality occurs during polishing 1 for a wafer.

As shown in the upper nine chart of FIG. 3, when an abnormality occurs during polishing 1 for a wafer, the polishing apparatus receives a processing interruption command from the FDC system in the fabrication plant (Fab), and interrupts the subsequent process steps including the remainder of polishing 1, polishing 2 and cleaning 1 to cleaning 4, for the wafer. In the upper chart of FIG. 3, the mark "○" indicates executed processing, and the mark "x" indicates interrupted processing. The wafer whose processing has been terminated by the processing interruption command is temporarily set and kept in a standby state (Partial) on a transport device, and a report on the results of processing of the wafer to the online system in the fabrication plant (Fab) is suspended (the processing results are not reported to the online system). Thereafter, the polishing apparatus automatically turns into a standby state (Partial). In this manner, the polishing apparatus becomes in the standby state (Partial) and the recipe can be customized.

The middle time chart of FIG. 3 is a time chart of reprocessing (Re-work) after customization of the recipe, and processing of the wafer is restarted according to this time chart. Because processing of the wafer has been interrupted in the course of polishing 1, processing of the wafer restarts at the interrupted point in polishing 1, and polishing 1 is carried out for the remaining polishing time. Thereafter, the wafer is subjected to polishing 2 and cleaning 1 to cleaning 4. In the middle chart of FIG. 3, the mark "x" indicates processing not to be executed, and the mark "○" indicates processing to be executed. After the restart, when the last processing step of cleaning 4 is executed, the results of processing are reported to the online system in the fabrication plant (Fab).

The lower time chart of FIG. 3 is a time chart as viewed from the online system in the fabrication plant (Fab). As depicted, the interruption of processing due to the occurrence of an abnormality is not recognized by the online system, and the processing process for the processing-interrupted wafer is treated as a sequence of process steps.

In the embodiments shown in FIGS. 2 and 3, processing of the wafer is restarted after customizing the recipe. However, it is possible to register a recipe for reprocessing in advance and to automatically perform the reprocessing. It is also possible to register three types of reprocessing recipes according to whether processing of a wafer is interrupted in the first polishing step (polishing 1), in the second polishing step (polishing 2) or in the cleaning process after the polishing process, to automatically select a recipe according to the interrupted processing location, and to perform reprocessing based on the selected recipe.

A description will now be given of the order of processing of wafers in the case where reprocessing is performed on a wafer whose processing has been interrupted due to the occurrence of an abnormality. In the following description, a wafer to be reprocessed will be referred to as a re-work wafer.

FIGS. 4A and 4B are timing charts showing the order of processing of re-work wafers. FIG. 4A shows the case where a re-work wafer is transported to the end of "same job" and FIG. 4B shows the case where a re-work wafer is transported to the front of unprocessed wafers. The "same job" herein refers to the same substrate processing to be performed for each of 25 wafers housed in one wafer cassette.

In the processing example shown in FIG. 4A, 25 wafers, i.e., wafer 1 to wafer 25, are processed in numerical order. Each wafer is subjected to the processing process comprising polishing 1, polishing 2, and cleaning 1 to cleaning 4.

As shown in FIG. 4A, when an abnormality occurs after the completion of polishing 1 for wafer 1, the subsequent process steps, i.e., polishing 2 and cleaning 1 to cleaning 4, are interrupted for the wafer, and the wafer is treated as "unprocessed.". Wafers 2 to 25 are normally processed in order. The processing-interrupted re-work wafer 1 is subjected to reprocessing (Re-work) after the last wafer 25. Because polishing 1 has been completed for the re-work wafer 1, reprocessing (Re-work) of the re-work wafer 1 restarts from polishing 2 and proceeds to cleaning 1 to cleaning 4. In the processing example shown in FIG. 4A, the re-work wafer 1 is reprocessed after the last wafer 25, and thus the method in this processing example has the drawback of necessitating a long waiting time before reprocessing.

In the processing example shown in FIG. 4B, as with the processing example shown in FIG. 4A, an abnormality occurs after the completion of polishing 1 for wafer 1, and the subsequent process steps are interrupted for the wafer. However, unlike the preceding example, the re-work wafer 1 is transported to the front of unprocessed wafers. Because polishing 1 has been completed for the re-work wafer 1, reprocessing (Re-work) of the re-work wafer 1 restarts from polishing 2 and proceeds to cleaning 1 to cleaning 4.

In the processing example shown in FIG. 4B, the re-work wafer 1 can be preferentially reprocessed by cutting in front of those unprocessed wafers which have not entered the processing process when processing of the re-work wafer 1 is interrupted due to the occurrence of an abnormality, than shortening a waiting time before reprocessing. Therefore, this interrupt-reprocessing method shown in FIG. 4B is preferable in the case of wafers, etc., whose surface to be processed are likely to deteriorate in quality during a long standby time before reprocessing.

In the method shown in FIG. 4B, a re-work wafer is preferentially reprocessed ahead of unprocessed wafers. However, it is possible to transport a re-work wafer to a location other than the front of unprocessed wafers and to process the re-work wafer preferentially. Further, in the case where there are a plurality of re-work wafers, the preference order of reprocessing of the re-work wafers may be arbitrarily selected.

Although certain preferred embodiments of the present invention have been shown and described in detail, it should be understood that various changes and modifications may be made without departing from the scope of the appended claims.

What is claimed is:

1. A substrate processing method for performing a predetermined processing of a substrate while sequentially transporting the substrate to a plurality of processing sections of a substrate processing apparatus provided in a fabrication plant according to a preset recipe, the substrate processing method comprising:

processing the substrate in one of the processing sections of the substrate processing apparatus, processing results of the substrate processing apparatus being managed by an online system provided outside the substrate processing apparatus and provided in the fabrication plant and having a host computer and operational situation of the substrate processing apparatus being monitored by a monitoring system which is an independent system provided outside the substrate processing apparatus and provided in the fabrication plant;

interrupting the processing of the substrate by a processing interruption command sent from the monitoring system to the substrate processing apparatus during processing of the substrate;

setting the substrate whose processing has been interrupted in a standby state in the substrate processing apparatus, wherein the processing results of the substrate being interrupted are not reported from the substrate processing apparatus to the online system;

customizing the recipe and performing reprocessing of the processing-interrupted substrate according to the customized recipe in the substrate processing apparatus, or performing reprocessing of the processing-interrupted substrate according to a preset recipe for reprocessing in the substrate processing apparatus; and reporting the result of processing which has been executed according to the customized recipe or the preset recipe for reprocessing from the substrate processing apparatus to the online system having the host computer.

2. The substrate processing method according to claim 1, wherein the substrate set in a standby state is set in a standby state on a transport device for transporting the substrate.

3. The substrate processing method according to claim 1, wherein the reprocessing of the substrate comprises performing the remaining processing in the predetermined processing after the interrupting.

4. The substrate processing method according to claim 1, wherein the predetermined processing comprises a plurality of process steps;

a plurality of recipes for reprocessing, corresponding to the plurality of process steps, are prepared, and the recipe for reprocessing is automatically selected according to the process step which has been performed when interrupting the processing of the substrate.

5. The substrate processing method according to claim 1, wherein the reprocessing of the processing-interrupted substrate is performed in preference to an unprocessed substrate when interrupting the processing of the substrate.

6. The substrate processing method according to claim 1, wherein when there is a plurality of substrates whose processing has been interrupted, the preference order of reprocessing of the substrates is selectable.

7. The substrate processing method according to claim 1, wherein the results of processing are reported to the online system after completion of the reprocessing of the substrate.

8. The substrate processing method according to claim 1, wherein the monitoring system for monitoring the operational situation of the substrate processing apparatus collects and analyzes processing point data to monitor variation in the data.

9. The substrate processing method according to claim 1, wherein the monitoring system for monitoring the operational situation of the substrate processing apparatus comprises a Fault Detection and Classification system.

* * * * *